(12) United States Patent
Ahn et al.

(10) Patent No.: US 8,234,438 B2
(45) Date of Patent: Jul. 31, 2012

(54) OPERATION METHOD OF NON-VOLATILE MEMORY

(75) Inventors: Seungeon Ahn, Suwon-si (KR); Keewon Kwon, Seongnam-si (KR); Jaechul Park, Seoul (KR); Youngsoo Park, Yongin-si (KR); Myoungjae Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 538 days.

(21) Appl. No.: 12/457,464

(22) Filed: Jun. 11, 2009

(65) Prior Publication Data

US 2010/0085821 A1      Apr. 8, 2010

(30) Foreign Application Priority Data

Oct. 6, 2008   (KR) .................. 10-2008-0097786

(51) Int. Cl.
*G06F 12/00*   (2006.01)
(52) U.S. Cl. .... 711/103; 711/156; 711/202; 365/185.33
(58) Field of Classification Search .................. 711/103, 711/156, 202; 365/185.33
See application file for complete search history.

(56) References Cited

U.S. PATENT DOCUMENTS

| | | | |
|---|---|---|---|
| 5,644,545 A * | 7/1997 | Fisch ............................ | 365/222 |
| 7,565,479 B2 * | 7/2009 | Best et al. ..................... | 711/106 |
| 8,041,878 B2 * | 10/2011 | Lee ................................ | 711/103 |
| 2002/0019898 A1 * | 2/2002 | Hayashi et al. ............... | 710/110 |
| 2002/0124203 A1 * | 9/2002 | Fang .............................. | 714/8 |
| 2006/0044934 A1 | 3/2006 | Wong et al. | |
| 2006/0129786 A1 | 6/2006 | Yamazaki | |
| 2006/0203542 A1 | 9/2006 | Kurotsuchi et al. | |
| 2006/0232606 A1 | 10/2006 | Kim et al. | |

FOREIGN PATENT DOCUMENTS

| | | |
|---|---|---|
| JP | 2005-346887 | 12/2005 |
| JP | 2006-236304 | 9/2006 |
| JP | 2007-334852 | 12/2007 |
| KR | 2003-0009276 | 1/2003 |
| KR | 2003-0025319 | 3/2003 |
| KR | 2006-0090744 | 8/2006 |
| KR | 10-2008-0034895 | 4/2008 |

* cited by examiner

*Primary Examiner* — Stephen Elmore
(74) *Attorney, Agent, or Firm* — Harness, Dickey & Pierce, P.L.C.

(57) ABSTRACT

Example embodiments provide a method of operating a non-volatile memory in which the non-volatile memory may only be changed from a first state to a second state and may not be changed from the second state to the first state during a programming operation.

20 Claims, 9 Drawing Sheets

| ROW | LUT | | | DATA STORAGE SPACE | |
|---|---|---|---|---|---|
| | TAG | LA | PA | PA | DATA |
| 1 | 1̄ | 0 0 0 1 | 0 0 0 1 | 0 0 0 1 | D1 |
| 2 | 0 | 0 0 1 0 | 0 0 1 0 | 0 0 1 0 | D2 |
| 3 | 0 | 0 0 0 1 | 0 0 1 1 | 0 0 1 1 | D3 |
| 4 | 0 | 0 0 0 0 | 0 0 0 0 | 0 1 0 0 | |
| . | . | . | . | . | |
| . | . | . | . | . | |
| . | . | . | . | . | |
| . | . | . | . | . | |
| . | . | . | . | . | |
| . | . | . | . | . | |
| 16 | 0 | 0 0 0 0 | 0 0 0 0 | 1 1 1 1 | |

| | LUT | | | | DATA STORAGE SPACE | |
|---|---|---|---|---|---|---|
| ROW | TAG | LA | PA | | PA | DATA |
| 1 | 0 | 0 0 0 0 | 0 0 0 0 | | 0 0 0 1 | |
| 2 | 0 | 0 0 0 0 | 0 0 0 0 | | 0 0 1 0 | |
| 3 | 0 | 0 0 0 0 | 0 0 0 0 | | 0 0 1 1 | |
| 4 | 0 | 0 0 0 0 | 0 0 0 0 | | 0 1 0 0 | |
| ⋮ | ⋮ | ⋮ | ⋮ | | ⋮ | |
| 16 | 0 | 0 0 0 0 | 0 0 0 0 | | 1 1 1 1 | |

FIG. 2B

| ROW | LUT | | | DATA STORAGE SPACE | |
|---|---|---|---|---|---|
| | TAG | LA | PA | PA | DATA |
| 1 | 0 | 0001 | 0001 | 0001 | D1 |
| 2 | 0 | 0000 | 0000 | 0010 | |
| 3 | 0 | 0000 | 0000 | 0011 | |
| 4 | 0 | 0000 | 0000 | 0100 | |
| ⋮ | ⋮ | ⋮ | ⋮ | ⋮ | |
| 16 | 0 | 0000 | 0000 | 1111 | |

FIG. 2C

| ROW | LUT | | | DATA STORAGE SPACE | |
|---|---|---|---|---|---|
|  | TAG | LA | PA | PA | DATA |
| 1 | 0 | 0 0 0 1 | 0 0 0 1 | 0 0 0 1 | D1 |
| 2 | 0 | 0 0 1 0 | 0 0 1 0 | 0 0 1 0 | D2 |
| 3 | 0 | 0 0 0 0 | 0 0 0 0 | 0 0 1 1 |  |
| 4 | 0 | 0 0 0 0 | 0 0 0 0 | 0 1 0 0 |  |
| ⋮ | ⋮ | ⋮ | ⋮ | ⋮ |  |
| 16 | 0 | 0 0 0 0 | 0 0 0 0 | 1 1 1 1 |  |

FIG. 2D

| ROW | LUT | | | DATA STORAGE SPACE | |
|---|---|---|---|---|---|
| | TAG | LA | PA | PA | DATA |
| 1 | <u>1</u> | 0 0 0 1 | 0 0 0 1 | 0 0 0 1 | D1 |
| 2 | 0 | 0 0 1 0 | 0 0 1 0 | 0 0 1 0 | D2 |
| 3 | 0 | <u>0 0 0 1</u> | <u>0 0 1 1</u> | 0 0 1 1 | <u>D3</u> |
| 4 | 0 | 0 0 0 0 | 0 0 0 0 | 0 1 0 0 | |
| ⋮ | ⋮ | ⋮ | ⋮ | ⋮ | |
| 16 | 0 | 0 0 0 0 | 0 0 0 0 | 1 1 1 1 | |

FIG. 3

| Row | Tag | LUT LA | PA | PA | DATA STORAGE SPACE |
|---|---|---|---|---|---|
| 1 | 1 | 0001 | 0001 | 0001 | D1 |
| 2 | 0 | 0010 | 0010 | 0010 | D2 |
| 3 | 1 | 0001 | 0011 | 0011 | D3 |
| 4 | 0 | 0001 | 0100 | 0100 | D4 |
| 5 | 1 | 0011 | 0101 | 0101 | D5 |
| 6 | 0 | 0100 | 0110 | 0110 | D6 |
| 7 | 0 | 0011 | 0111 | 0111 | D7 |
| 8 | 0 | 0000 | 0000 | 1000 | |
| 9 | 0 | 0000 | 0000 | 1001 | |
| 10 | 0 | 0000 | 0000 | 1010 | |
| 11 | 0 | 0000 | 0000 | 1011 | |
| 12 | 0 | 0000 | 0000 | 1100 | |
| 13 | 0 | 0000 | 0000 | 1101 | |
| 14 | 0 | 0000 | 0000 | 1110 | |
| 15 | 0 | 0000 | 0000 | 1111 | |
| 16 | 0 | 0000 | 0000 | | |

FIG. 4A

| ADDRESS | Tag | PT | DATA STORAGE SPACE |
|---|---|---|---|
| 0000 | 0 | 0000 | |
| 0001 | 0 | 0000 | |
| 0010 | 0 | 0000 | |
| 0011 | 0 | 0000 | D41 |
| 0100 | 0 | 0000 | |
| 0101 | 0 | 0000 | D42 |
| 0110 | 0 | 0000 | |
| 0111 | 0 | 0000 | |
| 1000 | 0 | 0000 | |
| 1001 | 0 | 0000 | |
| 1010 | 0 | 0000 | |
| 1011 | 0 | 0000 | |
| 1100 | 0 | 0000 | |
| 1101 | 0 | 0000 | |
| 1110 | 0 | 0000 | |
| 1111 | 0 | 0000 | |

FIG. 4B

| ADDRESS | Tag | PT | DATA STORAGE SPACE |
|---|---|---|---|
| 0000 | 0 | 0000 | |
| 0001 | 0 | 0000 | |
| 0010 | 0 | 0000 | |
| 0011 | 1 | 1111 | D41 |
| 0100 | 0 | 0000 | |
| 0101 | 0 | 0000 | D42 |
| 0110 | 0 | 0000 | |
| 0111 | 0 | 0000 | |
| 1000 | 0 | 0000 | |
| 1001 | 0 | 0000 | |
| 1010 | 0 | 0000 | |
| 1011 | 0 | 0000 | |
| 1100 | 0 | 0000 | |
| 1101 | 0 | 0000 | |
| 1110 | 0 | 0000 | |
| 1111 | 0 | 0000 | D43 |

FIG. 5

| ADDRESS | Tag | PT | DATA STORAGE SPACE |
|---|---|---|---|
| 0000 | 0 | 0000, 0000, ..., 0000 | |
| 0001 | 0 | 0000, 0000, ..., 0000 | |
| 0010 | 0 | 0000, 0000, ..., 0000 | |
| 0011 | 0 | 0000, 0000, ..., 0000 | |
| 0100 | 0 | 0000, 0000, ..., 0000 | |
| 0101 | 0 | 0000, 0000, ..., 0000 | |
| 0110 | 0 | 0000, 0000, ..., 0000 | |
| 0111 | 0 | 0000, 0000, ..., 0000 | |
| 1000 | 0 | 0000, 0000, ..., 0000 | |
| 1001 | 0 | 0000, 0000, ..., 0000 | |
| 1010 | 0 | 0000, 0000, ..., 0000 | |
| 1011 | 0 | 0000, 0000, ..., 0000 | |
| 1100 | 0 | 0000, 0000, ..., 0000 | |
| 1101 | 0 | 0000, 0000, ..., 0000 | |
| 1110 | 0 | 0000, 0000, ..., 0000 | |
| 1111 | 0 | 0000, 0000, ..., 0000 | |

OPERATION METHOD OF NON-VOLATILE MEMORY

FOREIGN PRIORITY STATEMENT

This application claims priority under 35 U.S.C. §119 to Korean Patent Application No. 10-2008-0097786, filed on Oct. 6, 2008, in the Korean Intellectual Property Office, the entire contents of which are incorporated herein by reference.

BACKGROUND

1. Field

Example embodiments provide a method of operating a non-volatile memory, and more particularly a method of operating a non-volatile memory in which the non-volatile memory is changed only from a first state to a second state and not from the second state to the first state.

2. Description of the Related Art

New types of memory cells have been developed to store information in different formats. For example, the new types of memory cells may include ferroelectric random access memory (FeRAM), magneto-resistive RAM (MRAM), phase-change RAM (PRAM) and resistive RAM (ReRAM). In particular, attention has been paid to PRAM and ReRAM from among these memory cells, since they may be fabricated with a material other than silicon and thus may be combined with three-dimensional (3D) stacked structures.

SUMMARY

Example embodiments provide a method of operating a non-volatile memory in which the non-volatile memory is changed only from a first state to a second state and not from the second state to the first state.

According to example embodiments, a method of operating a non-volatile memory may comprise writing a first logical address and a first physical address in a first row of a look-up table and programming first data to a data storage space indicated by the first physical address, wherein the look-up table includes a plurality of rows, each row having a tag, a logical address and a physical address; and writing the first logical address and a second physical address in a second row of the look-up table and programming the second data to a data storage space indicated by the second physical address, wherein writing the first logical address and second physical address and programming the second data is performed when an instruction requiring the first data be changed to second data is received, wherein the non-volatile memory includes a first state and a second state, wherein values of bits within the look-up table and the data storage space change from a first value to a second value during writing the first logical address and first physical address and programming the first data and during writing the first logical address and second physical address and programming the second data, and wherein the first value corresponds to the first state of the non-volatile memory and the second value corresponds to the second state of the non-volatile memory.

According to example embodiments, values of the bits constituting the look-up table and the data storage space may not change from the second value to the first value.

According to example embodiments, the non-volatile memory may have a lower resistance in the first state and a higher resistance in the second state.

According to example embodiments, a first voltage pulse signal allowing the non-volatile memory to be in the first state may have a first voltage and a first amplitude and a second pulse signal allowing the non-volatile memory to be in the second state may have a second-voltage and a second amplitude, wherein the first voltage is less than the second voltage, and wherein the first amplitude is greater than the second amplitude.

According to example embodiments, the second physical address may follow the first physical address.

According to example embodiments, the method may include changing a tag of the first row of the look-up table from the first value to the second value prior to programming the second data to the data storage space.

According to example embodiments, the method may include searching the look-up table for a row comprising a tag which includes the first logical address and has the first value when an instruction is received requiring data indicated by the first logical address be read, and reading data indicated by the second physical address included in the row.

According to example embodiments, the method may include a refresh operation of changing values of all bits constituting the look-up table and the data storage space from the second value to the first value after writing the first logical address and second physical address and programming the second data.

According to example embodiments, the non-volatile memory may be changed from the second state to the first state by one of an electrical signal, heat, and an electromagnetic wave.

According to example embodiments, the method may include programming in descending physical address order after the refresh operation is performed, if prior to the refresh operation programming was performed in ascending physical address order, and programming in ascending physical address order after the refresh operation is performed, if prior to the refresh operation programming was performed in descending physical order.

According to example embodiments, the programming after the refresh operation may be performed on a physical address following the second physical address.

According to example embodiments, the method may further include programming third data in a data storage space indicated by a third physical address mapped to the second logical address, wherein programming the third data is performed after programming the first data, and wherein programming the second data is performed before or after programming the third data.

According to example embodiments, the third physical address may follow the last physical address programmed in the data storage space.

According to example embodiments, the bits constituting the look-up table and the data storage space may be embodied as one of a resistive random access memory, a phase-change random access memory, and a magneto-resistive random access memory.

According to example embodiments, a method of operating a non-volatile memory may comprise writing a first physical address in a pointer of a first row of a look-up table and programming first data into a data storage space indicated by the first physical address, wherein the look-up table includes a plurality of rows, each row having a pointer; and writing a second physical address in a pointer of the first row of a look-up table and programming second data into a data storage space indicated by the second physical address, wherein writing the second physical address and programming the second data are performed when an instruction requiring the first data be changed to second data is received, wherein the non-volatile memory includes a first state and a second state, wherein values of bits within the look-up table and the data storage space change from a first value to a second value during writing the first physical address and programming the first data and during writing the second physical address and programming the second data, wherein the first value corresponds to the first state and the second value corresponds to the second state.

According to example embodiments, the values of the bits constituting the look-up table and the data storage space may not change from the second value to the first value.

According to example embodiments, each row of the look-up table may include a plurality of pointers and the second physical address is stored in a pointer of the first row which is different than the pointer of the first row storing the first physical address.

According to example embodiments, the bits constituting the look-up table and the data storage space may be embodied as one of a resistive random access memory, a phase-change random access memory, and a magneto-resistive random access memory.

According to example embodiments, a method of operating a non-volatile memory may include writing a logical address and a physical address in a row of a look-up table and programming first data to a storage space indicated by the physical address by changing values of bits within the look-up table and the data storage space from a first value to a second value, wherein the look-up table includes a plurality of rows, each row having a tag, a logical address and a physical address; performing a refreshing operation by changing values of all bits within the look-up table and the data storage space from the second value to the first value.

According to example embodiments, the refreshing operation may only be performed when an instruction requiring performance of the refreshing operation is received.

BRIEF DESCRIPTION OF THE DRAWINGS

The above and other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

FIG. 1 is a graph illustrating voltage-current characteristics of a ReRAM according to a method of operating a non-volatile memory according to example embodiments.

FIGS. 2A through 2D are diagrams illustrating a method of operating a non-volatile memory according to example embodiments.

FIG. 3 is a diagram illustrating a process of programming various data according to example embodiments after the method of FIGS. 2A through 2D is performed.

FIGS. 4A and 4B are diagrams illustrating a modified example embodiment of a method of operating a non-volatile memory.

FIG. 5 is a diagram illustrating another modified example embodiment of a method of operating a non-volatile memory.

DETAILED DESCRIPTION OF EXAMPLE EMBODIMENTS

Figures 1, 2A:
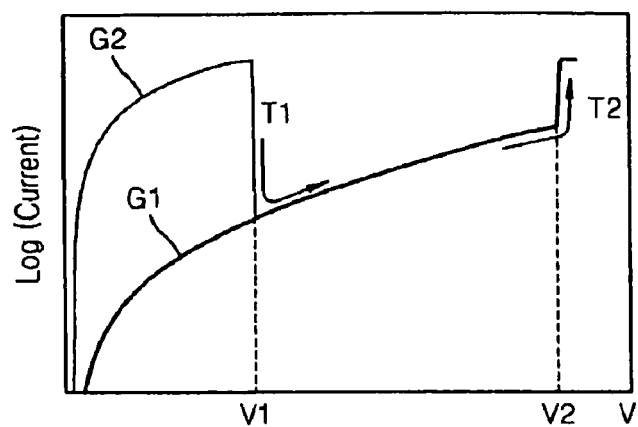

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A ReRAM may include a data storing material. The data storing material may be a nickel oxide layer (NiO), a vanadium oxide layer ($V_2O_5$), a zinc oxide layer (ZnO), a niobium oxide layer ($Nb_2O_5$), a titanium oxide layer ($TiO_2$), a tungsten oxide layer ($WO_3$), a cobalt oxide layer (CoO), or a combination thereof.

The state of the ReRAM may be determined according to a resistance value of the data storing material. The state of the ReRAM may be categorized into a set state or a reset state. The data storing material may have a lower resistance value in the set state and may have a higher resistance value in the reset state. The ReRAM may be in the set state or the reset state based on a voltage applied to the data storing material. If a given range of voltage is applied to the ReRAM, the state of the ReRAM may be determined without changing the state of the ReRAM.

FIG. 1 is a graph illustrating voltage-current characteristics of a ReRAM according to an example embodiment of a method of operating a non-volatile memory. In FIG. 1, the horizontal axis denotes a voltage applied to the ReRAM, and specifically, to a data storing material of the ReRAM. The vertical axis denotes current flowing through the ReRAM, and specifically, to the data storing material, according to the voltage applied.

Hereinafter, a voltage applied to the ReRAM means a voltage applied to the data storing material of the ReRAM, a current flowing through the ReRAM means a current flowing through the data storing material of the ReRAM, and a resistance of the ReRAM means a resistance of the data storing material of the ReRAM.

Referring to FIG. 1, when a voltage applied to the ReRAM is greater than a second voltage V2, soft breakdown may occur. If soft breakdown occurs, the data storing material of the ReRAM may exhibit conductivity and the resistance of the ReRAM may be lowered, and the state of the ReRAM may change to a set state. In FIG. 1, reference numeral 'T2' shows that the occurrence of soft breakdown may change the state of the ReRAM to the set state. Reference numeral 'G1' of FIG. 1 shows the current-voltage characteristics of the ReRAM in the set state. The current-voltage characteristics G1 shows that the resistance of the ReRAM may be lower in the set state.

When a voltage applied to the ReRAM is greater than a first voltage V1 and less than the second voltage V2, the conductivity of the data storing material of the ReRAM may be reduced or eliminated, the resistance of the ReRAM may become higher, and the state of the ReRAM may change to a reset state. In FIG. 1, reference numeral 'T1' shows that the state of the ReRAM may change to the reset state and reference numeral 'G2' shows the current-voltage characteristics of the ReRAM in the reset state. The current-voltage characteristics G2 show that the resistance of the ReRAM may increase in the reset state.

The reset state of the ReRAM may correspond to data '0' and the set state of the ReRAM may correspond to data '1'. Accordingly, one-bit data may be stored based on the two states of the ReRAM.

Referring to FIG. 1 and reference numerals G1 and G2, when a voltage applied to the ReRAM is less than the first voltage V1, the amount of current flowing through the ReRAM may vary according to the state of the ReRAM. Thus, whether the state of the ReRAM is the set state or the reset state may be determined by applying a voltage that is less than or equal to the first voltage V1 to the ReRAM. Further, whether data stored in the ReRAM is '1' or '0' may also be determined.

In an example embodiment of the method of operating a non-volatile memory, the state of the ReRAM is changed from the reset state to the set state during a programming operation, but not from the set state to the reset state because the set state of the ReRAM may be achieved with a higher reliability than the reset state. However, it should be noted that the reset state of the ReRAM may be reliably achieved by reducing the width of a voltage pulse signal and increasing the voltage of the voltage pulse signal.

A refresh operation of changing from the set state of a ReRAM to the reset state may be performed. The refresh operation may be performed periodically or aperiodically. The refresh operation may also be performed less frequently than the programming operation.

FIGS. 2A through 2D are diagrams illustrating example embodiments of a method of operating a non-volatile memory, such as a ReRAM. Referring to FIG. 2A, bits constituting a look-up table LUT and a data storage space may be initialized to '0', which may correspond to the reset state of the ReRAM. The look-up table LUT may include a plurality of rows ROW1 through ROW16. A tag (shown as TAG in FIGS. 2A through 2D), a logical address (shown as LA) and a physical address (shown as PA) may be written in each of the rows ROW1 through ROW16. Data may be written in the data storage space according to the physical address.

FIG. 2B illustrates an example embodiment of a process of writing a first data D1 to a data storage space mapped to a first logical address 0001. Referring to FIG. 2B, the first logical address 0001 and a first physical address 0001 may be written in the first row ROW1 of the look-up table LUT. Writing the first logical address 0001 and a first physical address 0001 into ROW1 may include a process of mapping the first logical address 0001 and the first physical address 0001 to each other. After the first logical address 0001 and first physical address 0001 are written into ROW1, the first data D1 may be programmed to a data storage space indicated by the first physical address 0001.

FIG. 2C illustrates an example embodiment of a process of writing second data D2 to a data storage space mapped to a second logical address 0010. Referring to FIG. 2C, the second logical address 0010 and a second physical address 0010 may be written in the second row ROW2 of the look-up table LUT. Writing the second logical address 0010 and the second physical address 0010 may include a process of mapping the second logical address 0010 and the second physical address 0010 to each other. After the first logical address 0001 and first physical address 0001 are written into ROW2, the second data D2 may be programmed to a data storage space indicated by the second physical address 0010.

Although the second physical address 0010 is described above as following the first physical address 0001, example embodiments are not limited thereto, and the second physical address may be any physical address that is different from the first physical address 0001. Further, although the second row ROW2 is described above as being the next row written after the first row ROW1, example embodiments are not limited thereto, and the second row ROW2 may be any row that is different from the first row ROW1.

FIG. 2D illustrates an example embodiment of a process of changing data mapped to the first logical address 0001 to a third data D3. Referring to FIG. 2D, a tag located in ROW1, in which the first logical address 0001 is written, may be changed from '0' to '1'. Changing the tag from '0' to '1' may change the first row ROW1 to an invalid row and accordingly the first data D1 stored at the first physical address 0001 may be invalid data.

Next, the first logical address 0001 and a third physical address 0011 may be written the third row ROW3 of the look-up table LUT Writing the first logical address 0001 and the third physical address 0011 may include a process of mapping the first logical address 0001 and third physical address 0011 to each other. After the first logical address 0001 and the third physical address 0011 are written into ROW3, the third data D3 may be programmed to a data storage space indicated by the third physical address 0011.

FIG. 3 is a diagram illustrating an example embodiment of a process of programming various data after an example embodiment of the method of FIGS. 2A through 2D has been performed. Referring to FIG. 3, when an instruction requiring data mapped to the first logical address 0001 be changed to fourth data D4 is received, a tag located in ROW3, where the first logical address 0001 is written, may be changed from '0' to '1'. Although the first logical address 0001 is also written in ROW1, ROW1 may be set as an invalid row, as described above with reference to FIG. 2D, when the tag located in ROW1 is changed from '0' to '1'.

Next, the first logical address 0001 and a fourth physical address 0100 may be written in a fourth row ROW4 of the look-up table LUT. Writing the first logical address 0001 and the fourth physical address 0100 may include a process of mapping the first logical address 0001 and the fourth physical address 0100 to each other. After the first logical address 0001 and the fourth physical address 0100 are written into ROW4, the fourth data D4 may be programmed to a data storage space indicated by the fourth physical address 0100.

Similarly, a fifth data D5, a sixth data D6 and a seventh data D7 may be programmed to data storage spaces.

As described above, example embodiments of the method of operating a non-volatile memory provide that bits of a tag, a logical address and a physical address may be changed from '0' to '1' but not from '1' to '0'. That is, a ReRAM may be changed from the reset to the set state to express bits, but not from the set state to the reset state.

Also, data may only be newly programmed to a data storage space, but data stored in the data storage space may not be changed. Thus, assuming bits in the data storage space are initialized to '0', the initialized bits may be changed from '0' to '1' but may not be changed from '1' to '0'.

The refresh operation, where bits in a data storage space are changed to '0', may be performed on all the bits in the data storage space at once. In the refresh operation, the state of a ReRAM may be changed from a second state, which may be '0', to a first state, which may be '1', by using an electrical signal, heat, or an electromagnetic wave, for example.

After the refresh operation is performed, the programming operation may be performed again. The programming operation may be performed with a physical address following the last physical address programmed prior to the performance of the refresh operation. For example, if the refresh operation is performed under an example embodiment illustrated in FIG. 3, programming may begin with a logical address and a physical address corresponding to the eighth row ROW8.

Example embodiments provide that, if programming is performed in ascending logical address order before the refresh operation is performed, programming may be performed in descending logical address order following the refresh operation. Alternative example embodiments provide that, if programming is performed in descending logical address order before the refresh operation is performed, programming may be performed in ascending logical address order following the refresh operation. For example, if the refresh operation is performed under an example embodiment illustrated in FIG. 3, programming of a sixteenth row ROW16, a fifteenth row ROW15, and a fourteenth row ROW14 may be performed in this order.

The example embodiments described with reference to FIG. 3 provide that a plurality of physical addresses in a data storage space may be evenly used, which may increase the lifetime of a non-volatile memory.

FIGS. 4A and 4B are diagrams illustrating a modified example embodiments of a method of operating a non-volatile memory. In the method illustrated in FIGS. 4A and 4B, a tag (shown as TAG), a pointer (shown as PT) and a data storage space are used. Similar to the method of FIGS. 2A through 2D, bits constituting a tag, a pointer and a data storage space may be changed from '0' to '1' during the programming operation, but are not changed from '1' to '0'. However, in the refresh operation, bits of a tag, a pointer and a data storage space are changed from '1' to '0' at once.

Referring to FIG. 4A, first data D41 and second data D42 may be written at a first address 0011 and a second address 0101, respectively. Referring to FIG. 4B, when an instruction is received that requires data indicated by the first address 0011 be changed into third data D43, a third address 111 may be stored in a pointer to a row in which the first address 0011 is written, and the third data D43 may be stored at the third address 1111. The data stored at the first address 0011 may not be changed, but the tag of the row in which the first address 0011 is written may be changed from '0' to '1', indicating that the data stored at the first address 0011 is invalid data.

FIG. 5 is a diagram illustrating a modified example embodiment of a method of operating a non-volatile memory. As shown in FIG. 5, a plurality of pointers may be present in one row in preparation for a possibility that data stored at one address may be changed more than once, and even several times. For example, when a first instruction requires data stored at an address be changed, the address may be stored in a first pointer. Further, when a second instruction requires the data stored at the address be changed, the address may be stored in a second pointer.

In the example embodiments shown in FIG. 5, bits of a tag (shown as TAG), the plurality of pointers (shown as PT) and a data storage space may be changed from '0' to '1' in a programming operation, but are not changed from '1' to '0'.

Although FIGS. 1 through 5 describe example embodiments of a method of operating a non-volatile memory with reference to a ReRAM, example embodiments are not limited thereto. Example embodiments of the method may be applied to various types of non-volatile memory, such as a PRAM or an MRAM.

Figure 6:
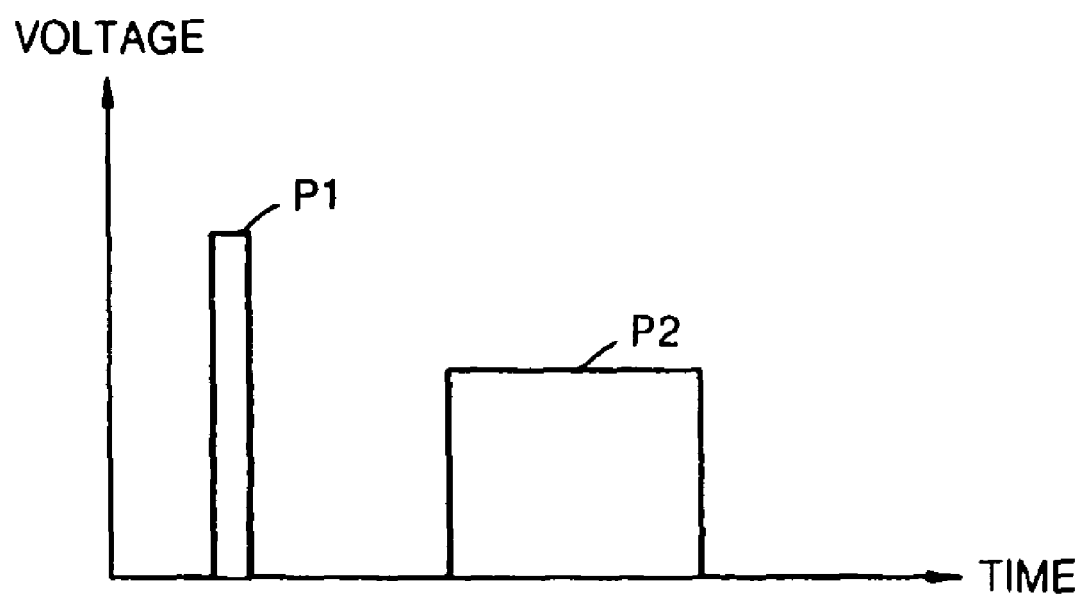
FIG. 6 is a graph illustrating voltage pulse signals applied to a phase-change RAM (PRAM) according to example embodiments.

FIG. 6 is a graph illustrating voltage pulse signals applied to a PRAM in a method of operating a non-volatile memory according to example embodiments. Referring to FIG. 6, when a first pulse signal P1 is supplied to the PRAM, the PRAM may be in the reset state, and when a second pulse signal P2 is supplied to the PRAM, the PRAM may be in the set state. The first pulse signal P1 may have greater amplitude and a shorter pulse duration than the second pulse signal P2.

Example embodiments of a method of operating a non-volatile memory further provide that a PRAM may be changed from the set state to the reset state during the programming operation, but not from the reset state to the set state. A refresh operation of changing from the set state of a PRAM to the reset state may be periodically or aperiodically performed. For example, the refresh operation may be performed less frequently than the programming operation.

Contrastingly, the PRAM may be changed from the reset state to the set state in the programming operation, but not from the set state to the reset state. In these example embodiments, the PRAM may be changed from the reset state to the set state in the refresh operation.

Example embodiments provide that, in a method of operating a non-volatile memory, the non-volatile memory may be changed from a first state to a second state in the programming operation and not from the second state to the first state, which may allow the non-volatile memory to achieve a more reliable state.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating a non-volatile memory, the method comprising:

writing a first logical address and a first physical address in a first row of a look-up table and programming first data to a data storage space indicated by the first physical address, wherein the look-up table includes a plurality of rows, each row having a tag, a logical address and a physical address; and writing the first logical address and a second physical address in a second row of the look-up table and programming second data to a data storage space indicated by the second physical address, wherein writing the first logical address and the second physical address and programming the second data is performed when an instruction requiring the first data be changed to the second data is received, wherein the non-volatile memory includes a first state and a second state, wherein values of bits within the look-up table and the data storage space change from a first value to a second value during writing the first logical address and the first physical address and programming the first data and during writing the first logical address and the second physical address and programming the second data, and wherein the first value corresponds to the first state of the non-volatile memory and the second value corresponds to the second state of the non-volatile memory.

2. The method of claim 1, wherein the values of bits constituting the look-up table and the data storage space do not change from the second value to the first value.

3. The method of claim 1, wherein the non-volatile memory has a lower resistance in the first state and a higher resistance in the second state.

4. The method of claim 1, wherein a first voltage pulse signal allowing the non-volatile memory to be in the first state has a first voltage and a first amplitude and a second pulse signal allowing the non-volatile memory to be in the second state has a second voltage and a second amplitude, wherein the first voltage is less than the second voltage, and wherein the first amplitude is greater than the second amplitude.

5. The method of claim 1, wherein the second physical address follows the first physical address.

6. The method of claim 1, further including changing a tag of the first row of the look-up table from the first value to the second value prior to programming the second data.

7. The method of claim 6, further including searching the look-up table for a row comprising a tag which includes the first logical address and has the first value when an instruction is received requiring data indicated by the first logical address be read, and reading data indicated by the second physical address included in the row.

8. The method of claim 1, further including a refresh operation of changing values of all bits constituting the look-up table and the data storage space from the second value to the first value after writing the first logical address and second physical address and programming the second data.

9. The method of claim 8, wherein the non-volatile memory is changed from the second state to the first state by one of an electrical signal, heat, and an electromagnetic wave.

10. The method of claim 8, further including programming in descending physical address order after the refresh operation is performed, if prior to the refresh operation programming was performed in ascending physical address order, and programming in ascending physical address order after the refresh operation is performed, if prior to the refresh operation programming was performed in descending physical order.

11. The method of claim 8, wherein programming after the refresh operation is performed on a physical address following the second physical address.

12. The method of claim 1, further including programming third data in a data storage space indicated by a third physical address mapped to a second logical address, wherein programming the third data is performed after programming the first data, and wherein programming the second data is performed before or after programming the third data.

13. The method of claim 12, wherein the third physical address follows the last physical address programmed in the data storage space.

14. The method of claim 1, wherein the bits constituting the look-up table and the data storage space are embodied as one of a resistive random access memory, a phase-change random access memory, and a magneto-resistive random access memory.

15. A method of operating a non-volatile memory, the method comprising:

writing a first physical address in a pointer of a first row of a look-up table and programming first data into a data storage space indicated by the first physical address, wherein the look-up table includes a plurality of rows, each row having a pointer; and writing a second physical address in a pointer of the first row of a look-up table and programming second data into a data storage space indicated by the second physical address, wherein writing the second physical address and programming the second data are performed when an instruction requiring the first data be changed to second data is received, wherein the non-volatile memory includes a first state and a second state, wherein values of bits within the look-up table and the data storage space change from a first value to a second value during writing the first physical address and programming the first data and during writing the second physical address and programming the second data, wherein the first value corresponds to the first state and the second value corresponds to the second state.

16. The method of claim 15, wherein the values of the bits constituting the look-up table and the data storage space do not change from the second value to the first value.

17. The method of claim 15, wherein each row of the look-up table includes a plurality of pointers and the second physical address is stored in a pointer of the first row which is different than the pointer of the first row storing the first physical address.

18. The method of claim 15, wherein the bits constituting the look-up table and the data storage space are embodied as one of a resistive random access memory, a phase-change random access memory, and a magneto-resistive random access memory.

19. A method of operating a non-volatile memory, the method comprising:

writing a logical address and a physical address in a row of a look-up table and programming first data to a storage space indicated by the physical address by changing values of bits within the look-up table and the data storage space from a first value to a second value, wherein the look-up table includes a plurality of rows, each row having a tag, a logical address and a physical address; and performing a refreshing operation by changing values of all bits within the look-up table and the data storage space from the second value to the first value.

20. The method of claim 19, wherein the refreshing operation is only performed when an instruction requiring performance of the refreshing operation is received.

* * * * *